United States Patent
Otremba et al.

(10) Patent No.: US 9,147,631 B2
(45) Date of Patent: Sep. 29, 2015

(54) SEMICONDUCTOR POWER DEVICE HAVING A HEAT SINK

(71) Applicant: Infineon Technologies Austria AG, Villach (AT)

(72) Inventors: Ralf Otremba, Kaufbeuren (DE); Josef Hoeglauer, Heimstetten (DE); Juergen Schredl, Mering (DE); Xaver Schloegel, Sachsenkam (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 36 days.

(21) Appl. No.: 13/864,350

(22) Filed: Apr. 17, 2013

(65) Prior Publication Data

US 2014/0312360 A1 Oct. 23, 2014

(51) Int. Cl.
*H01L 23/495* (2006.01)
*H01L 23/34* (2006.01)
*H01L 21/50* (2006.01)
*H01L 23/00* (2006.01)

(52) U.S. Cl.
CPC ............. *H01L 23/34* (2013.01); *H01L 21/50* (2013.01); *H01L 23/495* (2013.01); *H01L 23/49513* (2013.01); *H01L 23/49524* (2013.01); *H01L 23/49562* (2013.01); *H01L 23/49568* (2013.01); *H01L 24/33* (2013.01); *H01L 24/34* (2013.01); *H01L 2224/32245* (2013.01); *H01L 2224/83192* (2013.01); *H01L 2924/12032* (2013.01); *H01L 2924/1305* (2013.01); *H01L 2924/13055* (2013.01); *H01L 2924/13062* (2013.01); *H01L 2924/13091* (2013.01)

(58) Field of Classification Search
CPC .................................................. H01L 23/49568
USPC .................................... 257/675, 713; 438/122
See application file for complete search history.

(56) References Cited

U.S. PATENT DOCUMENTS

| | | | |
|---|---|---|---|
| 6,157,049 A | 12/2000 | Mitlehner et al. | |
| 8,735,223 B2 * | 5/2014 | Gao et al. | 438/122 |
| 2014/0284777 A1 * | 9/2014 | Otremba et al. | 257/666 |

FOREIGN PATENT DOCUMENTS

| | | |
|---|---|---|
| DE | 19610135 C1 | 6/1997 |
| DE | 102005034012 A1 | 11/2006 |

OTHER PUBLICATIONS

Otremba, Ralf, "Semiconductor Packages Having Multiple Lead Frames and Methods of Formation Thereof." U.S. Appl. No. 13/544,834, filed Jul. 9, 2012.

* cited by examiner

*Primary Examiner* — Mark Prenty
(74) *Attorney, Agent, or Firm* — Murphy, Bilak & Homiller, PLLC

(57) ABSTRACT

A semiconductor device includes an electrically conducting carrier having a mounting surface. The semiconductor device further includes a metal block having a first surface facing the electrically conducting carrier and a second surface facing away from the electrically conducting carrier. A semiconductor power chip is disposed over the second surface of the metal block.

18 Claims, 5 Drawing Sheets

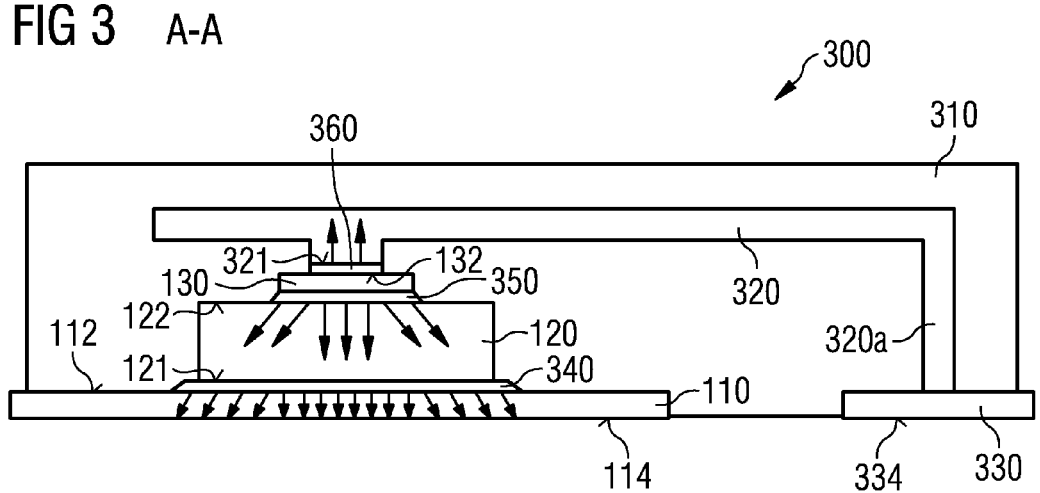
FIG 3  A-A
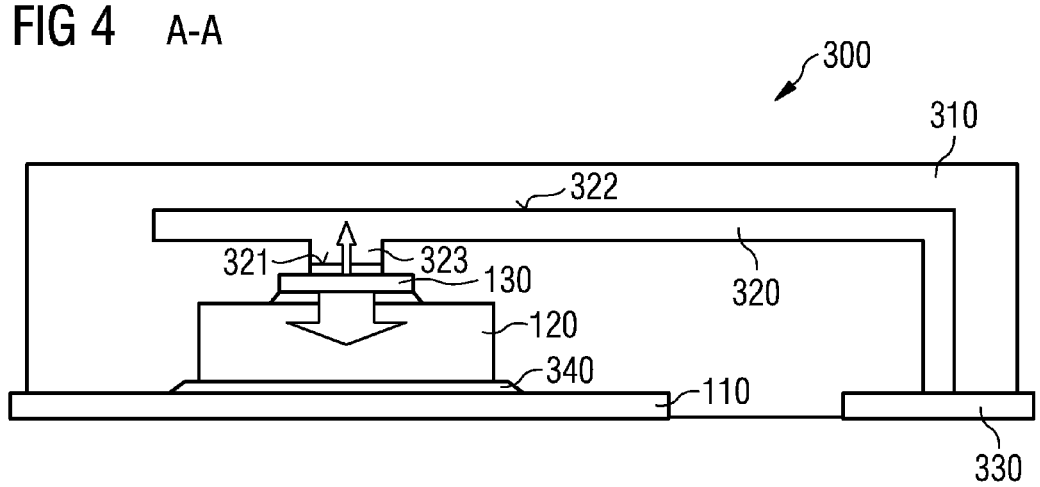
FIG 4  A-A

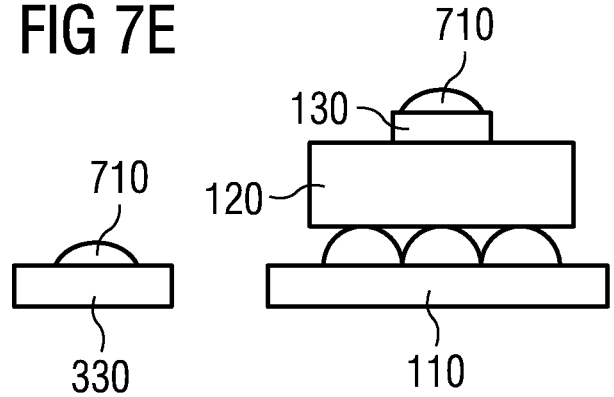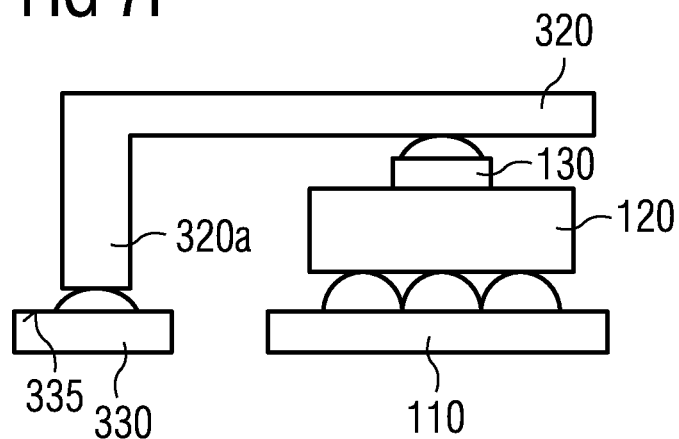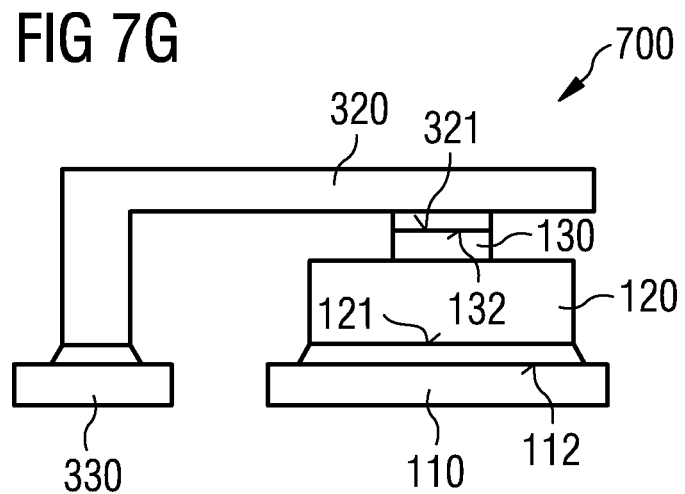

SEMICONDUCTOR POWER DEVICE HAVING A HEAT SINK

TECHNICAL FIELD

This invention relates to the technique of packaging, and in particular to the technique of packaging a semiconductor power chip.

BACKGROUND

Power semiconductor device manufacturers are constantly striving to increase the performance of their products, while decreasing their cost of manufacture. A cost intensive area in the manufacture of power semiconductor devices is packaging the semiconductor power chip. Performance of a power semiconductor device is dependent from the heat dissipation capability provided by the package. Packaging methods providing small high thermal robustness at low expenses are desirable.

For these and other reasons, there is a need for the present invention.

SUMMARY

According to an embodiment of a semiconductor device, the semicondcutor device comprises an electrically conducting carrier having a mounting surface, a metal block and a semicondcutor power chip. The metal block has a first surface facing the carrier and a second surface facing away from the electrically conducting carrier. The semiconductor power chip is disposed over the second surface of the metal block.

According to an embodiment of a semiconductor package, the semicondcutor package comprises a leadframe having a thickness Tl, a metal block and a semicondcutor power chip. The metal block is mounted on the leadframe. The metal block has a thickness Tm, wherein Tm is equal to or greater than 1.5 Tl. The semiconductor power chip is mounted on the metal block.

According to an embodiment of a method of manufacturing a semiconductor device, the method comprises: bonding a semiconductor power chip on a metal block; and bonding the metal block on an electrically conducting carrier.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 schematically illustrates a cross-sectional view of an exemplary power semiconductor device along line A-A in FIG. 5, further illustrating stationary thermal power dissipation.

FIG. 4 schematically illustrates a cross-sectional view of an exemplary power semiconductor device along line A-A in FIG. 5, further illustrating dynamic thermal power dissipation.

FIGS. 7A-7G schematically illustrate cross-sectional views of an exemplary process of a method of packaging a semiconductor power chip.

DETAILED DESCRIPTION

Figure 1:
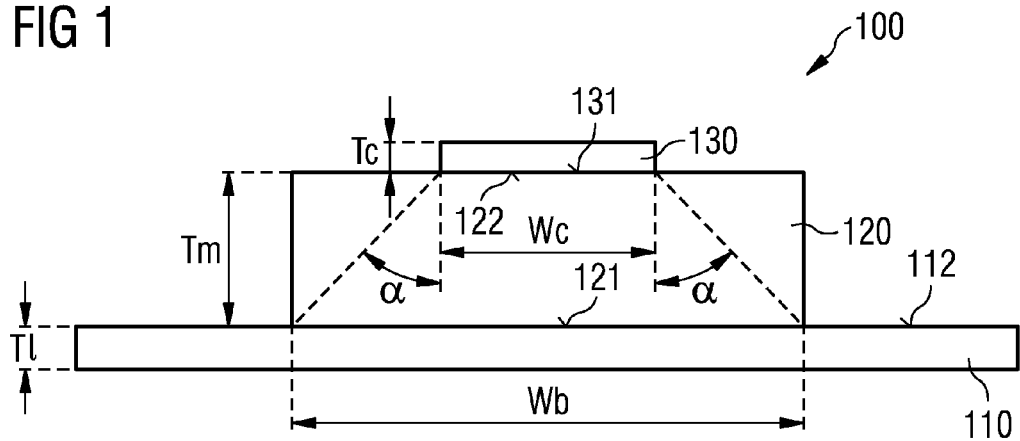
FIG. 1 schematically illustrates a cross-sectional view of an exemplary power semiconductor device.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "connected" are not meant to mean in general that elements must be directly coupled or connected together. Intervening elements may be provided between the "coupled" or "connected" elements. However, although not restricted to that meaning, the terms "coupled" and/or "connected" may also be understood to optionally disclose an aspect in which the elements are directly coupled or connected together without intervening elements provided between the "coupled" or "connected" elements.

Devices containing a semiconductor power chip are described herein. In particular, one or more semiconductor power chips having a vertical structure may be involved, that is to say that the semiconductor power chips may be fabricated in such a way that electric currents can flow in a direction perpendicular to the main surfaces of the semiconductor power chips. A semiconductor power chip having a vertical structure has electrodes on its two main surfaces, that is to say on its top side and bottom side. In various other embodiments, semiconductor power chips having a horizontal structure may be involved. A semiconductor power chip having a horizontal structure has electrodes only on one surface, that is to say on its top side.

The semiconductor power chip may be manufactured from specific semiconductor material such as, for example, Si, SiC, SiGe, GaAs, GaN, AlGaN, InGaAs, InAlAs, etc, and, furthermore, may contain inorganic and/or organic materials that are not semiconductors. The semiconductor power chips may be of different types and may be manufactured by different technologies.

Furthermore, the electronic devices described herein may optionally include one or more logic integrated circuit to control the semiconductor power chip. The logic integrated circuit may include one or more driver circuits to drive the semiconductor power chip. The logic integrated circuit may, e.g., be a microcontroller including, e.g., memory circuits, level shifters, etc.

The semiconductor power chip may have electrodes (chip pads) which allow electrical contact to be made with the integrated circuits included in the semiconductor power chip. The electrodes may include one or more metal layers which are applied to the semiconductor material of the semiconductor power chips. The metal layers may be manufactured with any desired geometric shape and any desired material composition. The metal layers may, for example, be in the form of a layer or land covering an area. By way of example, any desired metal capable of forming a solder bond or diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

Semiconductor power chips may, for example, be configured as power MOSFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g. a PIN diode or a Schottky diode. By way of example, in vertical devices, the source contact electrode and the gate contact electrode of a power MISFET or a power MOSFET or a HEMT may be situated on one main surface, while the drain contact electrode of the power MISFET or power MOSFET or HEMT may be arranged on the other main surface. However, semiconductor power chips as considered herein, e.g. HEMTs, may also be horizontal devices, with electrodes arranged only on the upper surface thereof.

The semiconductor power chip is mounted over an electrically conducting carrier. In various embodiments, the electrically conducting carrier may be a metal plate or sheet such as, e.g., a die pad of a leadframe. The metal plate or sheet may be made of any metal or metal alloy, e.g. copper or copper alloy. In other embodiments, the electrically conducting chip carrier may be made of plastics or ceramics. For instance, the electrically conducting chip carrier may comprise a layer of plastics coated with a metal layer. By way of example, such chip carrier may be a single-layer PCB or a multi-layer PCB. In other embodiments, the device carrier may comprise a plate of ceramics coated with a metal layer, e.g. a metal bonded ceramics substrate. By way of example, the electrically conducting carrier may be a DCB (direct copper bonded) ceramics substrate.

The semiconductor power chip may at least partly be surrounded or embedded in at least one electrically insulating material. The electrically insulating material forms an encapsulation body. The encapsulation body may comprise or be made of a mold material. Various techniques may be employed to form the encapsulation body of the mold material, for example compression molding, injection molding, powder molding or liquid molding. Further, the encapsulation body may have the shape of a piece of a layer, e.g. a piece of a sheet or foil that is laminated on top of the semiconductor power chip and the electrically conducting carrier. The encapsulation body may form part of the periphery of the package, i.e. may at least partly define the shape of the semiconductor device.

The electrically insulating material may comprise or be made of a thermoset material or a thermoplastic material. A thermoset material may, e.g., be made on the basis of an epoxy resin. A thermoplastic material may e.g. comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release.

The electrically insulating material forming the encapsulation body may comprise or be made of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In some embodiments, the electrically insulating material may be a laminate, e.g. a polymer foil or sheet. Heat and pressure may be applied for a time suitable to attach the polymer foil or sheet to the underlying structure. During lamination, the electrically insulating foil or sheet is capable of flowing (i.e. is in a plastic state), resulting in that gaps between the semiconductor power chips and/or other topological structures on the chip carriers are filled with the polymer material of the electrically insulating foil or sheet. The electrically insulating foil or sheet may comprise or be made of any appropriate thermoplastic or thermoset material. In one embodiment, the insulating foil or sheet may comprise or be made of a prepreg (short for pre-impregnated fibers), that is e.g. made of a combination of a fiber mat, for example glass or carbon fibers, and a resin, for example a thermoset or thermoplastic material. Prepreg materials are known in the art and are typically used to manufacture PCBs (printed circuit boards).

A metal block may be disposed between the electrically conducting carrier and the semiconductor power chip. The metal block may be mechanically, thermally and, e.g., electrically connected to the semiconductor power chip. The metal block may be made of any metal or metal alloy, in particular of metals having a high thermal conductivity and/or a high thermal capacity. By way of example, the metal block may comprise or be made of copper or a copper alloy. The metal block may be made of bulk metal material. The metal block may allow both for effective static heat dissipation and effective dynamic heat dissipation of thermal power loss of the semiconductor power chip having a high thermal power loss areal density.

A connection element such as, e.g., a contact clip may be electrically and mechanically connected to a load electrode of the semiconductor power chip which is arranged at a semiconductor power chip surface opposite to the surface where the semiconductor power chip is connected to the metal block. The connection element may also be of other type than a contact clip. It may, e.g., also be implemented by a (plurality of) ribbon(s) or a (plurality of) bonding wire(s).

A variety of different types of electronic devices may be configured to use a metal block as described herein or may be manufactured by the techniques described herein. By way of example, an electronic device in accordance with the disclosure may constitute, e.g., a power supply, a DC-DC voltage converter, an AC-DC voltage converter, a power amplifier, and many other power devices.

In various embodiments, an electronic device disclosed herein may, e.g., comprise a power cascode circuitry on the basis of, e.g., a HEMT. Such cascode circuitry is referred to as a HEMT cascode in the art. HEMTs, in particular HEMT cascodes, may, e.g., be based on GaN, AlGaN, InGaAs, InAlAs. They may, e.g., be used as switching devices, AC-DC converters, power amplifiers, RF-circuits, etc.

Power semiconductor devices equipped with a metal block as described herein may contain a power SiC MOSFET or a power SiC diode as a semiconductor power chip. Similar to HEMTs, SiC-MOSFETs and SiC diodes are small in size while experiencing high thermal power losses. Further, half-bridge circuits including a high side transistor and a low side transistor may use a metal block as described herein. Half-bridge circuits may, e.g., be used as AC-DC converters or DC-DC converters.

Generally, DC-DC converters may be used to convert a DC input voltage provided by a battery or rechargeable battery into a DC output voltage matched to the demands of electronic circuits connected downstream. By way of example, a DC-DC converter described herein may be a buck converter or down-converter. AC-DC converters may be used to convert an AC input voltage provided by, e.g., a high voltage AC power network into a DC output voltage matched to the demands of electronic circuits connected downstream.

In general, any power device comprising a semiconductor power chip having a high thermal power loss and a comparatively small footprint area to dissipate the thermal power may benefit from the disclosure herein. By way of example, semiconductor power chips having, in operation, a thermal power loss of equal to or greater than, e.g., 1 W, 3 W, 5 W, 7 W, 10 W, and, e.g., and a footprint area for thermal power dissipation equal to or less than 15 mm$^2$, 10 mm$^2$, 7 mm$^2$, 5 mm$^2$, 3 mm$^2$ may use a metal block as described herein for improving thermal behavior and power dissipation during operation.

FIG. 1 illustrates a cross-sectional view of an exemplary semiconductor device 100. The semiconductor device 100 comprises an electrically conducting carrier 110, a semiconductor power chip 130 and a metal block 120 disposed between the electrically conducting carrier 110 and the semiconductor power chip 130.

The electrically conducting carrier 110 may be made of a flat metal plate, e.g. a die pad of a leadframe. By way of example, the electrically conducting carrier 110 may be made of a bulk metal material. A thickness of the electrically conducting carrier 110 is denoted by Tl. The thickness Tl may, e.g., be equal to or greater than 0.1 mm, 0.3 mm, 0.5 mm. The thickness Tl may be equal to or less than 0.7 mm, 0.5 mm, 0.4 mm, 0.2 mm, 0.1 mm.

The semiconductor power chip 130 may, e.g., be a GaN-HEMT, a Si- or SiC-power MOSFET or -power diode. The semiconductor power chip 130 may have high thermal losses during operation, e.g., a thermal power loss (thermal dissipation) in the range between 1 W and 10 W, or even more. The thermal power generated in the semiconductor power chip 130 during operation must be drained in order to avoid overheating, degradation or breakdown of the semiconductor power chip 130. The semiconductor power chip 130 may be configured to operate at voltages greater than 50 V, 100 V, 300 V, 500 V, or 1000 V. The semiconductor power chip 130 may have a thickness Tc measured between the first surface 131 and an opposite second surface 132 of the semiconductor power chip 130 of equal to or less than 300 µm, 200 µm, 100 µm, 80 µm, or 50 µm.

The metal block 120 has a first surface 121 facing the electrically conducting carrier 110 and a second surface 122 facing away from the electrically conducting carrier 110. The semiconductor power chip 130 is disposed over the second surface 122 of the metal block 120.

The metal block 120 has a thickness denoted by Tm. The thickness Tm of the metal block 120 is measured between the first surface 121 and the second surface 122 of the metal block 120. The thickness Tm may be equal to or greater than 1.5, 2.0, 3.0, 4.0 or 5.0 times the thickness Tl of the electrically conducting carrier 110. By way of example, the thickness Tm may be equal to or greater than 0.5 mm, 0.75 mm, 1.0 mm, 1.25 mm, or 1.5 mm.

The first surface 121 of the metal block 120 may have an area size of equal to or greater than 8.0 mm$^2$, 14.0 mm$^2$, 20.0 mm$^2$, or 26.0 mm$^2$. The first surface 121 of the metal block 120 may be fully connected to an upper surface 112 of the electrically conducting carrier 110.

The semiconductor power chip 130 has a first surface 131 which is connected to the second surface 122 of the metal block 120. The first surface 131 of the semiconductor power chip 130 may, e.g., be defined by the outline of an electrode or metal coating (not shown in FIG. 1) located on the first surface 131 of the semiconductor power chip 130 and facing the second surface 122 of the metal block 120. Thus, the first surface 131 of the semiconductor power chip 130 is the surface of the semiconductor power chip 130 connected to the second surface 122 of the metal block 120 and, by virtue of this connection, is effective to transfer heat from the semiconductor power chip 130 to the metal block 120. In many cases, the first surface 131 of the semiconductor power chip 130 may correspond to the footprint of the semiconductor power chip 130 or may have a size which is identical to or nearly as great as the area size of the footprint of the semiconductor power chip 130. Thus, as used herein, the first surface 131 of the semiconductor power chip 130 is the surface thereof which is effective to transfer heat from the semiconductor power chip 130 to the first surface 121 of the metal block 120. For the sake of simplicity, in the following description no difference is made between the footprint surface of the semiconductor power chip 130 and the first surface 131 of the semiconductor power chip 130.

As will be explained further below in more detail, the efficiency of the heat removal by the metal block 120 is dependent from design parameters of the metal block 120. In particular, the metal block 120 should provide for heat flow dilation in a direction away from the semiconductor power chip 130. That is, the area of heat transition from the metal block 120 to the electrically conducting carrier 110 should be larger than the area of heat transition from the semiconductor power chip 130 to the metal block 120.

By way of example, the area size of the first surface 121 of the metal block 120 may be equal to or greater than $$4Tm \cdot (Tm + Fc^{0.5}) + Fc, \quad (1)$$

wherein Fc is the area size of the first surface 131 of the semiconductor power chip 130.

The expansion of the area of heat transition from semiconductor power chip 130 to the metal block 120 and from the metal block 120 to the electrically conducting carrier 110 is illustrated by the dashed line in FIG. 1. It is to be noted that equation (1) may, e.g., correspond to an implementation in which the difference between a lateral dimension Wb of the first surface 121 of the metal block 120 and a lateral dimension Wc of the first surface 131 of the semiconductor power chip 130 is at least twice 2Tm/3 (if, by way of example and without loss of generality, square heat transition areas would be assumed). In this and other examples the metal block 120 may offer a geometric spreading angle α of 30 degree or more between the dashed line connecting the edges of the first surfaces 121 and 131 and a vertical direction corresponding to the main direction of heat flow.

Further, by way of example, the area size of the first surface 121 of the metal block 120 may be equal to or greater than $$3Tm \cdot (3Tm/4 + Fc^{0.5}) + Fc. \quad (2)$$

Equation (2) may, e.g., correspond to an implementation in which the difference between a lateral dimension Wb of the first surface 121 of the metal block 120 and a lateral dimension Wc of the first surface 131 of the semiconductor power chip 130 is at least twice the thickness Tm of the metal block 120. In this and other examples the metal block 120 may offer a geometric spreading angle α of 45 degree or more between the dashed line connecting the edges of the first surfaces 121 and 131 and a vertical direction corresponding to the main direction of heat flow. By way of example, the lateral dimensions Wb of the metal block 120 may be in a range between 2×2 mm and 8×8 mm, more particularly in a range between 3.5×3.5 mm and 6.5×6.5 mm.

The metal block 120 may be made of a metal or a metal alloy having a high thermal conductivity. Further, the metal block 120 may be made of a metal having a high thermal capacity. By way of example, the metal block 120 may comprise or be made of copper or a copper alloy.

Figure 2:
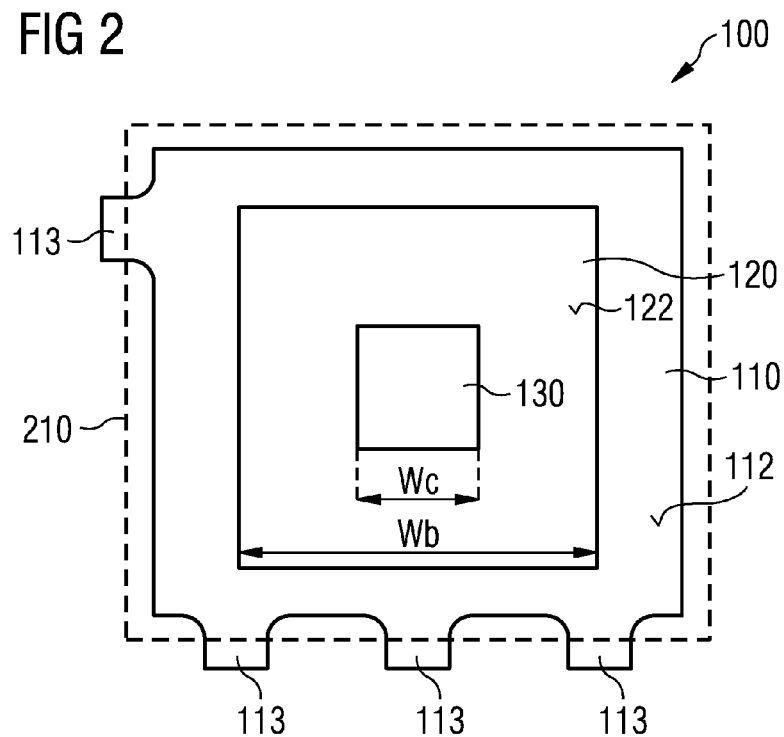
FIG. 2 schematically illustrates a top view of an exemplary power semiconductor device.

Referring to FIG. 2, an exemplary top view of the power semiconductor device 100 is shown. By way of example, the semiconductor power chip 130 may have a rectangular or quadratic shape. Similarly, the metal block 120 may, e.g., have a rectangular or quadratic shape. In FIG. 2 the illustrated outline of the semiconductor power chip 130 corresponds to the outline of the first surface 131 of the semiconductor power chip 130 and the illustrated outline of the metal block 120 corresponds to the first surface 121 of the metal block 120. Thus, the illustrated outlines define the areas of heat transfer from the semiconductor power chip 130 to the metal block 120 and from the metal block 120 to the electrically conducting carrier 110. As mentioned before, the area sizes of these heat transfer areas are significantly different. By way of example, a ratio of area size of the first surface 121 of the metal block 120 to the area size of the first surface 131 of the semiconductor power chip 130 may be equal to or greater than 5.0, 7.0, 11.0, or 13.0.

The electrically conducting carrier 110 may also have an overall rectangular or quadratic shape. By way of example, the electrically conducting carrier 110 may comprise protrusions 113 projecting from the periphery of the electrically conducting carrier 110. As illustrated in FIG. 2, the protrusions 113 may project out of an encapsulation body 210 made of an insulating material. The encapsulation body 210 (which is not shown in FIG. 1) may partly or completely embed the metal block 120 and the semiconductor power chip 130 placed thereon.

FIG. 3 illustrates a semiconductor device 300. With a view of the electrical conducting carrier 110, the metal block 120 and the semiconductor power chip 130, the semiconductor device 300 may, e.g., have the same design, specifications and dimensions as semiconductor device 100. Further, the semiconductor device 300 may comprise an electrically conducting connection element 320 having a first surface 321 connected to the second surface 132 of the semiconductor power chip 130, which is opposite to the first surface 131 of the semiconductor power chip 130. In FIG. 3 the connection element 320 may, e.g., be electrically and mechanically connected to an electrode (not shown) at the second surface 132 of the semiconductor power chip 130. The connection element 320 may be a contact clip or another means for connecting a semiconductor power chip to an external terminal of a package, e.g. a ribbon or a plurality of bonding wires.

The connection element 320 may extend in at least one lateral dimension over the outline of the semiconductor power chip 130, over the outline of the metal block 120 and, e.g., over the outline of the electrically conducting carrier 110. The connection element 320 may have a bent portion or protrusion 320a which may be connected to a contact pad 330. The contact pad 330 may be coplanar with the electrically conducting carrier 110. Further, the contact pad 330 may, e.g., be made of the same material as the electrically conducting carrier 110. By way of example, the contact pad 330 may be a lead of the leadframe of which the electrically conducting carrier 110 forms a die pad.

The semiconductor device 300 may further comprise an electrically insulating material, e.g. a mold material, forming an encapsulation body 310 (corresponding to the encapsulation body 210 of FIG. 2). The encapsulation body 310 may partly or completely embed, e.g., the metal block 120, e.g. the semiconductor power chip 130, and, e.g., the connection element 320.

A lower surface 114 of the electrically conducting carrier 110 and a lower surface 334 of the contact pad 330 may be exposed at the periphery of the semiconductor device 300. These surfaces 114, 334 may form external terminals of the semiconductor device 300. Thus, the lower surface 114 of the electrically conducting carrier 110 and the lower surface 334 of the contact pad 330 may be configured to be connected to an application board (not shown) to which the semiconductor device 300 is mounted.

The semiconductor device 300 may comprise various package types such as, e.g., QFN (Quad Flat No-Lead)-type packages with, e.g., a half-etch leadframe, or other leadframe-based package types. The semiconductor device 300 may comprise a package as outline in the open standards from JEDEC (Joint Electron Device Engineering Council), e.g., a Super-SO8 package according to JEDEC MO-240, the features corresponding to the dimensions of the package, the pin counts, etc., are incorporated herein by reference.

FIG. 3 also provides an exemplary, more detailed disclosure of semiconductor device 100 forming part of the semiconductor device 300. As illustrated in FIG. 3, a first bonding layer 340 may be located adjacent to the upper surface 112 of the electrically conducting carrier 110 and the first surface 121 of the metal block 120, a second bonding layer 350 may be located adjacent to the second surface 122 of the metal block 120 and the first surface 131 of the semiconductor power chip 130, and a third bonding layer 360 may be located adjacent to the second surface 132 of the semiconductor power chip 130 and the first surface 321 of the connection element 320.

The bonding layers 340, 350, 360 may, e.g., each form a diffusion solder bond comprising or be made of, e.g., AuSn, AgSn, CuSn, AgIn, AuIn, AuGe, CuIn, AuSi, Sn or Au. Further, soft solder bonds, hard solder bonds, sintered metal bonds and/or electrically conducting adhesive bonds may be used to form one or more of the first, second or third bonding layers 340, 350, 360.

The first, second and/or third bonding layers 340, 350, 360 may have high thermal conductivity and/or small thickness. By way of example, the thickness of the first, second and/or third bonding layer 340, 350, 360 may, e.g., be equal to or less than 10 μm, 5 μm, 2 μm. The smaller the thickness the better is the heat transport over the corresponding bonding layer 340, 350, 360.

The mode of functioning of the metal block 120 in view of its thermal effects will be explained in the following by reference to FIGS. 3 and 4. FIGS. 3 and 4 are identical with each other except that FIG. 3 schematically illustrates stationary thermal power dissipation and FIG. 4 schematically illustrates dynamic thermal power dissipation.

Stationary thermal power dissipation relates to the average thermal power produced in the semiconductor power chip 130 during operation. This thermal power is produced continuously in the semiconductor power chip 130 and, therefore, has to be continuously conducted away from the semiconductor power chip 130. The arrows in FIG. 3 illustrate the main directions of the heat flow within the metal block 120, the electrically conducting carrier 110 and the connection element 320. In the metal block 120 the main direction of heat flow dilates in a lateral direction with increasing distance from the semiconductor power chip 130 (or from the second surface 122 of the metal block 120). That is, due to the dimensional design of the metal block 120, the heat flow is allowed to dilate when traversing the metal block 120. As a consequence of this spatial dilation of the heat flow, a large-area heat flow interface is offered at the first surface 121 of the metal block 120. This large size transition area for heat dissipation between the metal block 120 and the electrically conducting carrier 110 allows for continuous and efficient heat removal. Stated differently, the metal block 120 may be regarded as a "heat flow geometric converter" shaped to match the spatial properties of heat flow dilation in solid bodies.

In accordance with the disclosure it is possible to significantly reduce the thickness T1 of the electrically conducting carrier 110 for achieving the same stationary thermal power dissipation compared to a conventional implementation without the metal block 120. Since in power applications the cost for the electrically conducting carrier 110 (e.g. leadframe) is a substantial contribution to the total costs of packaging, the provision of the metal block 120, by allowing to reduce the thickness T1, substantially decreases the total costs of packaging.

In addition, dynamic thermal power dissipation is considered. Dynamic thermal power dissipation relates to fluctuations in the generation of thermal power in the semiconductor power chip 130. The thermal power generated in the semiconductor power chip 130 is time-variant. Time variance may, e.g., be caused by the time-variant operation of the semiconductor power chip 130 or a time-variant operation of a load connected thereto or both.

Dynamic thermal power dissipation is combated by the heat capacity of the metal block 120, which is tightly coupled to the semiconductor power chip 130. The heat capacity of the metal block 120 provides for a short-time heat storage facility. The storage of heat from dynamic dissipation in the metal block 120 provides for a temporary cooling of the semiconductor power chip 110. In other words, the metal block 120 adds an effective heat capacity to the heat capacity of the semiconductor power chip 130, which prevents power loss peaks to overheat the semiconductor power chip 130.

In FIG. 4 the solid arrow from the semiconductor power chip 130 into the metal block 120 illustrates the capacity of dynamic thermal power dissipation into the metal block 120. The thinner solid arrow from the semiconductor power chip 130 into the connection element 320 illustrates the capacity of dynamic thermal power dissipation into the connection element 320.

The connection element 320 may be equipped with a projection 323 forming a region of enhanced thickness measured between the first surface 321 of the connection element 320 and a second, upper surface 322 of the connection element 320. The projection 323 also provides for a heat capacity serving as a short-time heat storage facility during time-variant operation of the semiconductor power chip 130.

In conclusion, the metal block 120 may provide both for an enhanced stationary cooling by virtue of lateral heat flow dilation and for an enhanced short-term cooling by coupling additional heat capacity for buffering temperature peaks caused by fluctuating thermal power dissipation.

Figure 5:
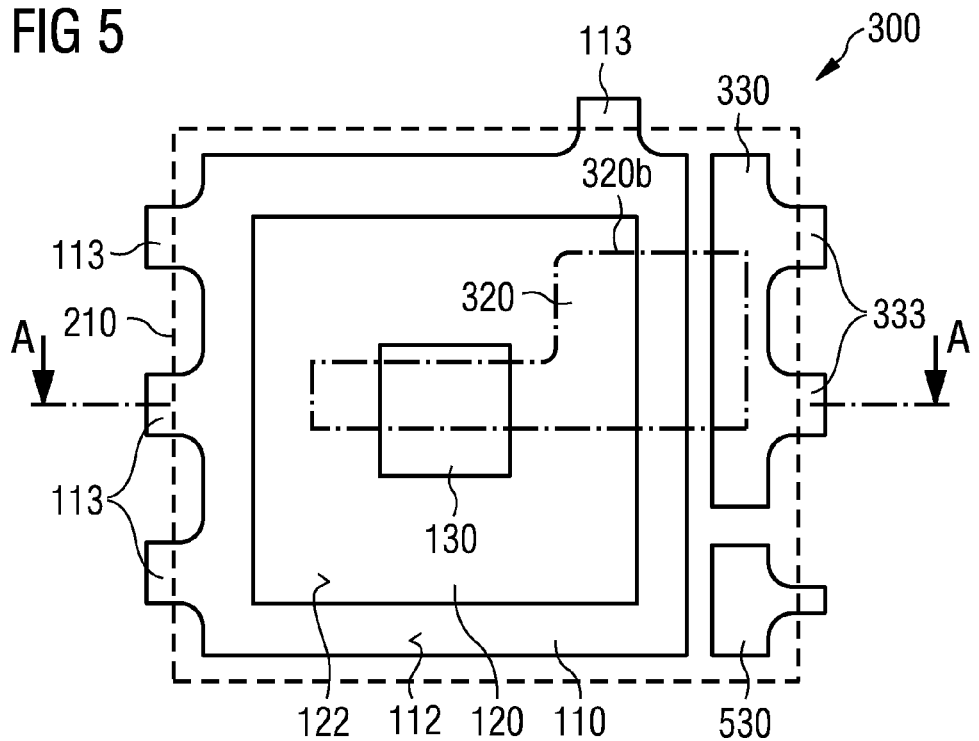
FIG. 5 schematically illustrates a top view of an exemplary power semiconductor device.

FIG. 5 illustrates a top view of the exemplary semiconductor device 300. Line A-A is a section line corresponding, e.g., to the sectional views of FIGS. 3 and 4. FIG. 5 is similar to FIG. 2 and reference is made to the corresponding description in order to avoid reiteration. Further, FIG. 5 illustrates the contact pad 330, which may be arranged along at least a part of one side of the encapsulation body 210. Similar to the electrically conducting carrier 110, the contact pad 330 may have protrusions 333 projecting out of the encapsulation body 210 and being exposed to form, e.g., external terminals of the semiconductor device 300. As shown in FIG. 5, the semiconductor power chip 130 may be electrically connected to the contact pad 330 by the connection element 320. In order to provide high conductivity, the connection element 320 may have a portion 320b of increased width arranged between the semiconductor power chip 130 and the contact pad 330.

Further, the semiconductor device 300 may comprise a further contact pad 530. The contact pad 530 may be electrically connected to an electrode, e.g. the gate electrode, of the semiconductor power chip 130. By way of example, a bond wire (not shown) may be used for the electrical connection.

Figure 6:
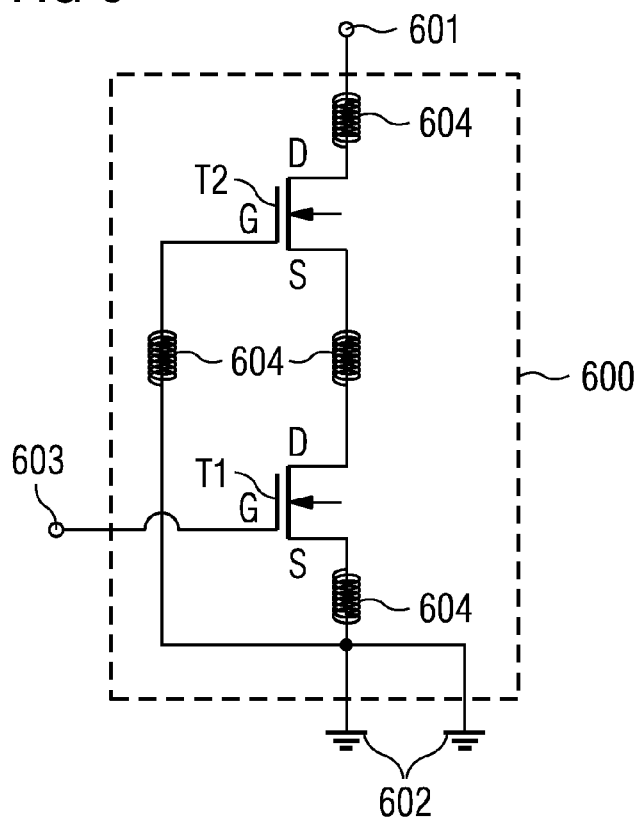
FIG. 6 illustrates a basic circuit diagram of a half-bridge power semiconductor device.

FIG. 6 illustrates, by way of example, an exemplary circuitry of a power supply 600 using a high power transistor T2 and a low-voltage transistor T1 arranged in a cascode circuit. The high power transistor T2 may, e.g., be a HEMT, e.g., a GaN HEMT. The critical field of GaN is ten times larger than in Si, thus allowing for small size and high power/high voltage applications. Further, GaN offers low charge, fast switching capabilities. Other materials, such as, e.g., SiC, also have critical fields which are significantly larger than the critical field of Si, and may therefore also demand for extensive heat removal over small-area heat transition interfaces. The low-voltage transistor T1 may, e.g., be a FET, e.g. as Si-MOSFET.

The transistors T1, T2 may be vertical or horizontal devices. The power supply 600 may, e.g., be an AC-DC converter. The DC voltage provided at an output 601 may, e.g., be equal to or greater than 100 V, 200 V, 400 V, 600 V, etc. Terminal 602 may be connected to a negative supply voltage or ground. An input voltage of e.g., 0 to 5 V at terminal 603 may be used to operate the gate of transistor T1. The gate of transistor T2 may, e.g., be connected to a the negative supply voltage or ground. Inductances 604 may be connected between ground and the source terminal of transistor T1, ground and the gate terminal of transistor T2, the drain of transistor T1 and the source of transistor T2, and the drain of transistor T2 and the output 601.

GaN HEMT T2 is a normally-on device. However, connecting the low voltage FET T1 to the source of the GaN HEMT T2 via the cascode circuitry will transform the HEMT T2 to a normally-off transistor.

The power supply 600 may be realized as a dual chip device. That is, the low voltage FET T1 may be implemented in a single semiconductor power chip, and the high voltage HEMT T2 may also be implemented in a single semiconductor power chip 130, which may, e.g., be packaged in accordance with the disclosure herein.

Figure 7A:
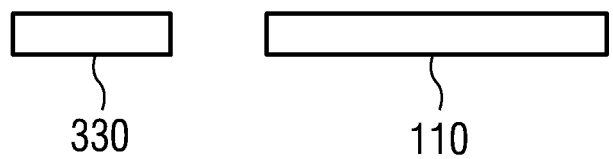

FIGS. 7A-7G illustrate, by way of example, stages of an exemplary method of manufacturing a semiconductor power device 700. The semiconductor power device 700, as shown in FIG. 7G, is similar to the semiconductor power devices 100, 300, and reference is made to the corresponding description herein in order to avoid reiteration.

FIG. 7A illustrates providing the electrically conducting carrier 110 and the contact pad 330. As mentioned above, the electrically conducting carrier 110 and the contact pad 330 may have lower and/or upper surfaces being coplanar with each other, respectively.

Figure 7B:
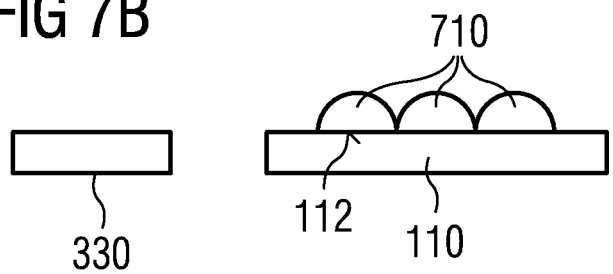

According to FIG. 7B, a bonding material 710 may be deposited on the upper surface 112 of the electrically conducting carrier 110. The bonding material 710 may, e.g., comprise or consist of solder, a soft solder, a diffusion solder, a paste, a nanopaste, or an electrically conductive adhesive. Depositing the bonding material 710 on the carrier 110 may be performed in a batch process, i.e. for a plurality of semiconductor devices 700 which are manufactured in parallel.

More specifically, the bonding material 710 may, e.g., be made of a soldering material for diffusion solder bond as recited above, by a paste containing metal particles distributed in a polymer material or resin such as, e.g., α-terpineol, or other materials. Metal particles contained in a paste may, for example, be made of silver, gold, copper, tin or nickel. The extensions (average diameter) of the metal particles may, e.g., be smaller than 100 nm and, in particular, smaller than 50 nm. These pastes are also referred to as nanopastes in the art.

Figure 7C:
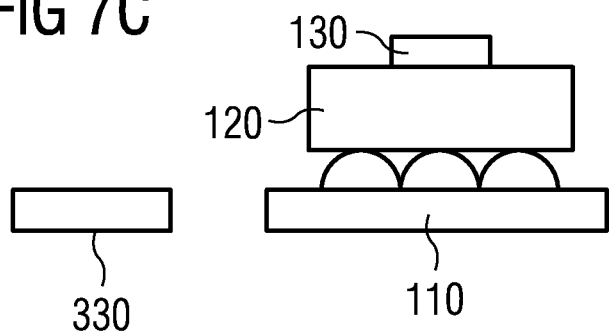

As shown in FIG. 7C, the metal block 120 is placed on the bonding material 710 over the carrier 110. At that time, the semiconductor power chip 130 may already be mounted on the metal block 120, e.g. by using a bonding layer as described above. In particular a diffusion solder bonding layer providing for a tight thermal coupling between the semiconductor power chip 130 and the metal block 120 may be used.

Figure 7D:
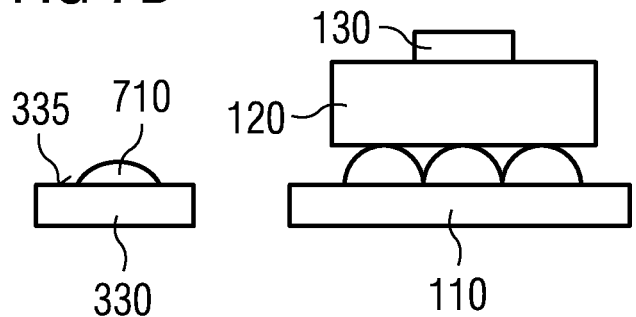

Referring to FIG. 7D, bonding material 710 is deposited on an upper surface 335 of the contact pad 330. Depositing the bonding material 710 on the upper surface 335 may also be performed in a batch process, i.e. for a plurality of semiconductor power devices 700 which are manufactured in parallel.

Referring to FIG. 7E, bonding material 710 is deposited on the second surface 132 of the semiconductor power chip 130. Depositing the bonding material 710 on the second surface 132 may also be performed concurrently with the deposition step shown in FIG. 7D.

Referring to FIG. 7F, the connection element 320 may be placed over the bonding materials 710 deposited in FIGS. 7D and 7E. Placing connection elements 320 over a plurality of semiconductor power chips 130 and contact pads 330 may be performed in a batch process.

Referring to FIG. 7G, energy is applied in order to reflow, sinter or cure the bonding material 710. The energy may be applied by heat, radiation, etc. By way of example, heat may be applied in an oven, e.g. a reflow oven. By the application of energy the bonding material 710, e.g. solder, metal paste, conductive adhesive, electrically and mechanically connects the upper surface 112 of the carrier 110 to the first surface 121 of the metal block 120, the second surface 132 of the semiconductor power chip 130 to the lower surface 321 of the connection element 320 and the upper surface 335 of the contact pad 330 to the lower surface 321 at the protrusion 320a of the connection element 320.

The sequential process stages as illustrated in FIGS. 7A-7G may, e.g., be performed in different order. By way of example, the metal block 120 may be bonded to the electrically conducting carrier 110 after the step of FIG. 7C and before the step of FIG. 7D. According to another variation, the semiconductor power chip 130 may only be placed on but not be bonded to the metal block 120 in FIG. 7F. In this case, one single final temperature process, e.g., reflow step, may be sufficient to generate all bonding connections in semiconductor device 700.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    an electrically conducting carrier having a mounting surface;
    a metal block having a first surface facing the carrier and a second surface facing away from the electrically conducting carrier;
    a semiconductor power chip disposed over the second surface of the metal block, the semiconductor power chip having a first surface which faces the second surface of the metal block and a second surface opposite the first surface; and
    a contact clip electrically and mechanically connected to a load electrode of the semiconductor power chip, the load electrode being arranged at the second surface of the power semiconductor chip.

2. The semiconductor device of claim 1, further comprising:
    a first bonding layer mechanically and electrically connecting the mounting surface of the electrically conducting carrier to the first surface of the metal block.

3. The semiconductor device of claim 2, wherein the first bonding layer is a diffusion solder layer, a soft solder layer, a sintered metal layer, a nanopaste layer, or a conducting adhesive layer.

4. The semiconductor device of claim 2, further comprising:
    a second bonding layer mechanically and electrically connecting the second surface of the metal block to the first surface of the semiconductor power chip.

5. The semiconductor device of claim 4, wherein the second bonding layer is a diffusion solder layer, a soft solder layer, a sintered metal layer, a nanopaste layer, or a conducting adhesive layer.

6. The semiconductor device of claim 1, wherein the metal block has a thickness measured between the first and second surfaces of the metal block of equal to or greater than 0.5 mm, 0.75 mm, 1.0 mm, 1.25 mm, or 1.5 mm.

7. The semiconductor device of claim 1, wherein the metal block has a thickness measured between the first and second surfaces of the metal block of equal to or greater than 1.5, 2.0, 3.0, 4.0, or 5.0 times the thickness of the electrically conducting carrier.

8. The semiconductor device of claim 1, wherein an area size of the first surface of the metal block is equal to or greater than 8.0 mm$^2$, 14.0 mm$^2$, 20.0 mm$^2$, or 26.0 mm$^2$.

9. The semiconductor device of claim 1, wherein an area size of a first surface of the semiconductor power chip connected to the second surface of the metal block is equal to or less than 10.0 mm$^2$, 7.5 mm$^2$, 5.0 mm$^2$, 2.5 mm$^2$, or 1.0 mm$^2$.

10. The semiconductor device of claim 1, wherein an area size of the first surface of the metal block is equal to or greater than $3Tm \cdot (3Tm/4 + Fc^{0.5}) + Fc$, wherein Tm is the thickness of the metal block measured between the first and second surfaces of the metal block and Fc is an area size of a first surface of the semiconductor power chip connected to the second surface of the metal block.

11. The semiconductor device of claim 1, wherein an area size of the first surface of the metal block is equal to or greater than $4Tm \cdot (Tm + Fc^{0.5}) + Fc$, wherein Tm is the thickness of the metal block measured between the first and second surfaces of the metal block and Fc is an area size of a first surface of the semiconductor power chip connected to the second surface of the metal block.

12. The semiconductor device of claim 1, wherein the semiconductor power chip is a vertical semiconductor power chip.

13. The semiconductor device of claim 1, wherein the semiconductor power chip is a GaN-power chip, Si-power chip, or SiC-power chip.

14. The semiconductor device of claim 1, wherein a thermal power of the semiconductor power chip is equal to or greater than 3.0 W, 5.0 W, 7.0 W, or 9.0 W.

15. The semiconductor device of claim 1, wherein the semiconductor device is an AC-DC converter or a DC-DC converter.

16. A semiconductor device, comprising:
   an electrically conducting carrier having a mounting surface;
   a metal block having a first surface facing the carrier and a second surface facing away from the electrically conducting carrier; and
   a semiconductor power chip disposed over the second surface of the metal block,
   wherein the metal block has a thickness measured between the first and second surfaces of the metal block of equal to or greater than 0.5 mm, 0.75 mm, 1.0 mm, 1.25 mm, or 1.5 mm.

17. A semiconductor device, comprising:
   an electrically conducting carrier having a mounting surface;
   a metal block having a first surface facing the carrier and a second surface facing away from the electrically conducting carrier; and
   a semiconductor power chip disposed over the second surface of the metal block,
   wherein an area size of the first surface of the metal block is equal to or greater than 8.0 mm$^2$, 14.0 mm$^2$, 20.0 mm$^2$, or 26.0 mm$^2$.

18. A semiconductor device, comprising:
   an electrically conducting carrier having a mounting surface;
   a metal block having a first surface facing the carrier and a second surface facing away from the electrically conducting carrier; and
   a semiconductor power chip disposed over the second surface of the metal block,
   wherein an area size of a first surface of the semiconductor power chip connected to the second surface of the metal block is equal to or less than 10.0 mm$^2$, 7.5 mm$^2$, 5.0 mm$^2$, 2.5 mm$^2$, or 1.0 mm$^2$.

* * * * *